United States Patent
Kohlstedt et al.

(10) Patent No.: US 6,812,039 B1
(45) Date of Patent: Nov. 2, 2004

(54) METHOD FOR PRODUCING A MAGNETIC TUNNEL CONTACT AND MAGNETIC TUNNEL CONTACT

(75) Inventors: Hermann Kohlstedt, Kerpen (DE); Peter Rottländer, Villers-les-Nancy (FR)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 10/049,036

(22) PCT Filed: Jul. 21, 2000

(86) PCT No.: PCT/EP00/07012

§ 371 (c)(1),
(2), (4) Date: Feb. 5, 2002

(87) PCT Pub. No.: WO01/13387

PCT Pub. Date: Feb. 22, 2001

(30) Foreign Application Priority Data

Aug. 12, 1999 (DE) .......................................... 199 38 215

(51) Int. Cl.[7] .............................................. H01L 21/00
(52) U.S. Cl. ........................... 438/3; 438/795; 438/796; 360/324.2; 257/421; 257/43
(58) Field of Search ............................ 438/3, 308, 378, 438/795, 476, 653, 771, 796; 257/3, 9, 43, 422; 360/324.2

(56) References Cited

U.S. PATENT DOCUMENTS 6,226,160 B1 * 5/2001 Gallagher et al. ....... 360/324.2

6,341,053 B1 * 1/2002 Nakada et al. ........... 360/324.2

FOREIGN PATENT DOCUMENTS

| DE | 198 18 547 | 4/1999 |
| EP | 0 573157 | 12/1993 |
| WO | Wo-97/39488 | 10/1997 |

OTHER PUBLICATIONS

Magnetic Tunnel Junctions Prepared . . . by Rottländer et al., Journal of Magnetism, 210(2000).

Strongly Reduced Bias Dependence in Spin–Tunnel Junctions . . . by Boeve et al., Appl. Phys. vol. 76 No. 8 (2000).

Magnetic Tunneling Applied to memory . . . by Daughton, Appl. Phys. 81, 3741 (1997).

Bias Voltage and Temperature Dependence . . . by Yu Lu et al.Appl.Phys. Journal, vol. 83,No. 11, 1998.

Voltage Dependence of Magnetoresistance . . . by J. Zhang et al. Journal of Appl. Phys. vol.83, No. 11, 1998.

Exchanged–Biased Magnetic Tunnel Junctions . . . by Matsuda et al., Journal of Appl. Phys. vol. 85,No. 8 (1999).

(List continued on next page.)

*Primary Examiner*—Dung Le
(74) *Attorney, Agent, or Firm*—Herbert Dubno

(57) ABSTRACT

Disclosed is a method for producing a magnetic tunnel contact. A metal layer is disposed on a first ferromagnetic layer (1) and is oxidised for producing an insulation layer (3). A second ferromagnetic layer (2) is produced on the insulation layer (3), whereby oxidation of the metal layer is supported by UV-light.

11 Claims, 1 Drawing Sheet

OTHER PUBLICATIONS

Low Resistance Spin–Dependency Tunnel Junctions . . . by Sun et al. Appl. Phys. Letters vol. 74, No. 3, 1999.

High Conductance Small–Area Magnetoresistive . . . by Wong et al., Appl.Phys.Letters vol. 73 No. 3 1998.

High Conductance Magneto Resistive Tunnel Junctions with Multiple . . . by Wong et al., Journal Appl Phys vol. 83, No. 11 19998.

Magnetic Tunnel Junctions with in Situ . . . by Tsuge et al., Appl.Phys.Lett.71(22) 1997.

Spin–Dependent Tunneling Junctions with Hard Magnetic Layer . . . Bby Bobo et al. Journal of Appl.phys vol. 83, No. 11 1998.

Spin Tunneling Magnto Resistance . . . by Kumagai et al. Journal of Magnetis, 166 (1997).

Spin Dependent Tunneling Devices Fabricated Using Photolythography by Beech et al. IEEE, Sep. 1996.

Search Report issued by German patent Office.

Giant Magnetic Tunneling Effect . . . by Myazaki et al., Journal of Magnetism . . . 139 (1995)L231 L234.

* cited by examiner

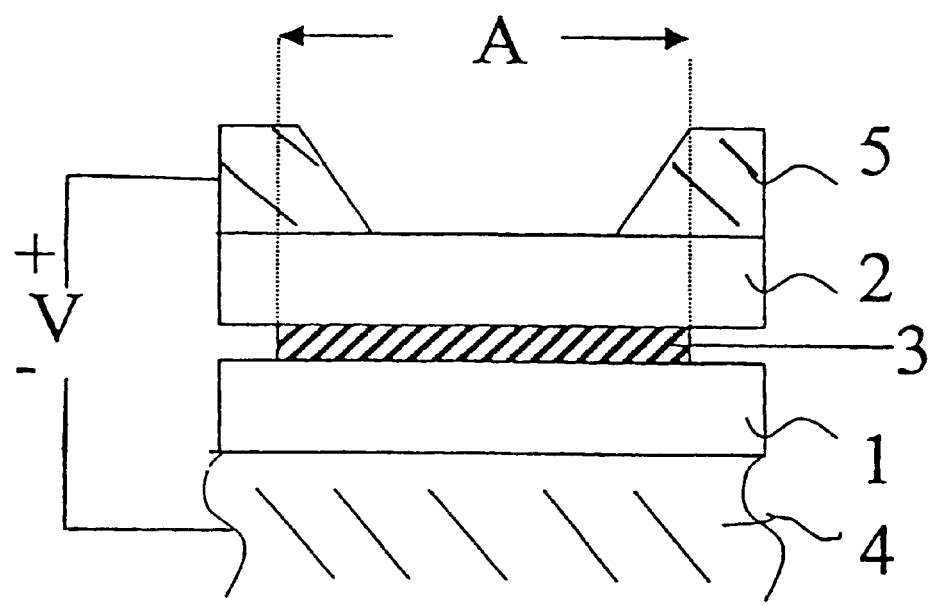
Fig.

METHOD FOR PRODUCING A MAGNETIC TUNNEL CONTACT AND MAGNETIC TUNNEL CONTACT

The invention relates to a method for producing a magnetic tunnel contact according to the preamble of claim 1 as well as a magnetic tunnel contact in accordance with the preamble of claim 4.

Up to now, ferroelectric and magnetoresistive storage technologies have been developed at high cost in which dynamic random access memory DRAM has been replaced by nonvolatile supply voltage independent storage components, designated as FRAM (ferroelectric random access memory) or MRAM (magnetic random access memory).

For MRAMs, various magnetoresistive effects can be contemplated. AMR (anisotropic magnetoresistance) storage is based upon the fact that the resistance to electrical currents in a direction parallel to the magnetization direction of a conductive material and perpendicular to the magnetization direction differ. The GMR (giant magnetoresistance) storage concept is based upon the giant magnetoresistance effect which arises in layer stacks comprised of alternating magnetic layers, of nanometer thinness, e.g. of cobalt, and nonmagnetic layers (e.g. of copper). A third candidate for MRAMs are magnetic tunnel contacts. They are comprised of two ferromagnetic layers which are separated by a thin tunnel insulated layer.

A further field of use for components based upon the magnetoresistive effect is the magnetic field sensor technology. To date AMR magnetic field sensors, GMR magnetic field sensors and tunnel magnetic field sensors are known.

The manner in which magnetic tunnel contacts work rests upon a spin-dependent change of the tunnel resistance (TMR: tunneling magnetoresistance) for normally conducting electrons which is based upon a spin polarization of the participating magnetic layer. Until a brief time ago, this effect had only interest as a matter of principle since the relative change in the magnetoresistance $\Delta R/R$ was less than 1% for the pin-dependent tunnels. The situation changed in 1995 with T. Miyazaki et al in "Giant Magnetic Tunneling Effect in Fe/Al$_2$O$_3$/Fe Junction" J. Magn. Magn. Matter. 139, pages L231–L234, which was directed to magnetic tunnel contacts with $\Delta R/R$ values $\geq 18\%$ at room temperature.

A substantial advantage of the magnetic tunnel contact resides in that it is high ohmic and thus has greater compatibility with the existing integrated semiconductor circuits than the low ohmic AMR or GMR elements. Thus it is to be expected that magnetic tunnel contacts have the best perspective [sic: prospects] (as memory or sensor elements) for integration in coming generations of chips.

For the acceptability of a magnetic tunnel contact for use in integrated circuitry it is required that the magnetic tunnel contact have, apart from the previously discussed requirement, the greatest possible relative change in the magnetoresistance $\Delta R/R$, a resistance-area product RA which lies in a range from $10^2$ to a maximum of about $10^4 \Omega \times \mu m^2$ optimally. Magnetic tunnel contacts which simultaneously satisfy these two requirements could not hitherto have been made.

In the publication representing the closest prior art "Magnetic Tunneling Applied to Memory", of J. M. Daughton, J. Appl. Phys. 81, pages 3758–3763 (1997), a magnetic tunnel contact is described with relative magnetoresistance change $\Delta R/R$ of 20% and a resistance-area product RA of $10-10^6$ $k\Omega \times \mu m^2$ is used. To produce the tunnel insulating layer a 2 nm thick partially oxidized Al layer and an 0.6 nm thick completely oxidized Al$_2$O$_3$ layer is used. It has been found to be advantageous to utilize an incompletely oxidized metal layer as the magnetic tunnel layer.

In the publication "Bias Voltage and Temperature Dependence of Magnetotunneling Effect", Yu Lu, et al, J. Appl. Phys., 83 Pages 6515–6517, (1998), a magnetic tunnel layer has been described which utilizes an oxidized aluminum layer as the tunnel barrier layer. To produce the oxidized barrier layer, a 0.5 to 1.5 nm thin aluminum layer is deposited on the lower ferromagnetic layer of the tunnel contact and then with a plasma oxidizing process is oxidized. Advantageously in the plasma oxidation method short oxidation times (30 seconds to 7 minutes) suffice to produce the insulating layer and it is possible to obtain a sufficiently high relative magnetoresistance (more than 16% at room temperature). It is however a drawback that the magnetic tunnel insulating layer produced with this process has too high a resistance-area product RA for integration in semiconductor chips.

In the publication "Preparation of Nb/Al—AlO$_x$/Nb Josephson Junctions with Critical Current Densities Down to 1 A/cm$^2$" of L. Fritzsch, et al., PHYSICA C 296, pages 319–324, (1998), a method for producing tunnel insulating layers is described for a superconductive Josephson tunnel contacts. In the process, an 8 nm electric aluminum layer is deposited on a niobium electrode and by means of a UV light supported oxidation process is completely oxidized to a 1.3 mm thick surface layer region. The Josephson tunnel contact must be operated at a temperature below the critical temperature (9.2 K) of the niobium and based upon the tunnels with Cooper pairs comprised of two paired electrons with opposite spin, the publication contributes nothing with respect to possible uses of such systems outside the range of superconductive tunnel contacts and especially can give no indication of its magnetic characteristics.

The object of the invention is to provide a process for producing a metallic tunnel contact which is comparable with different processes common in semiconductor technology and enables a magnetic tunnel contact to be obtained for integration in semiconductor circuits which has a satisfactory electrical characteristic. It is further a target of the invention to provide a magnetic tunnel contact such that the use thereof in future semiconductor circuits, especially in the form of a MRAM or a magnetic field sensor is appropriate.

The invention is attained with the features of claims 1 and 4.

Through the use of the UV light supported oxidation process, magnetic tunnel contacts can be obtained which at 300 K have a relative magnetoresistance of more than 10% (and at a first try up to 22%) and a resistance-area product RA of less than 10 $k\Omega \times \mu m^2$, especially less than 2 $k\Omega \times \mu m^2$, (and at the first tests up to 0.3 $k\Omega \times \mu m^2$) so that with the process according to the invention magnetic tunnel contacts with a good sensitivity (i.e. with a large relative magnetoresistance ratio $\Delta R/R$) and values for the resistance-area product RA can be made which are optimal for MRAM applications with respect to switching speed and compatibility for CMOS readout circuits. It has been found to be advantageous to carry out the process according to the invention so that the oxidation process on the one hand is merely a stoichiometric oxidation of the metal without any remaining nonoxidized metal component and, on the other hand, by contrast to the aggressive plasma oxidation or etching process which is known to the state of the art, a precise self-limiting oxidation stop is obtained at the boundary layer to the ferromagnetic material lying thereunder.

A further advantage of the process in accordance with the invention resides in that in spite of the relatively "clean" oxidation it can be carried out sufficiently rapidly so that it can be integrated in the duration of the semiconductor fabrication process. Since metal depositions steps and oxidation steps have long been used in semiconductor technology, no difficulties arise in integration of the process into that process technology.

Advantageously in the deposition of the metal layer the coating thickness is adjusted to a maximum of about 2 nm. This ensures that the deposited metal layer will be completely oxidized (i.e. not only stoichiometrically but also through the total layer). It has been found that nonoxidized metal components in the insulation layer should be avoided to the extent possible since they produce lower values for the resistance-area product. The material for the metal layer is preferably Al, Mg, Hf, Ta, Zr, Y or Er.

A further advantageous feature is that the tunnel contact is structured by a lithographic step and an ion beam step in especially an elliptical form. Via the form anisotropy a magnetic easy access is defined whose effect is to capture for the magnetic domain a preferred direction along the longitudinal axis of the ellipse.

Of special advantage is the use of the magnetic tunnel contact according to the invention in a memory cell and/or in a magnetic field sensor.

Further advantageous configurations of the invention are given in the dependent claims. The invention is described in greater detail with respect to an example and with reference to the drawing in which the sole FIG. shows a schematic cross sectional view of a magnetic tunnel contact.

The tunnel contact has a lower hard magnetic layer, for example a Co layer 1, an upper soft magnetic layer, for example a NiFe layer 2, and a tunnel insulation layer 3 between the two ferromagnetic layers 1, 2. The tunnel insulation layer 3 is comprised advantageously completely of stoichiometric $Al_2O_3$ and is produced in the manner still to be described. Below the hard magnetic lower layer 1 and above the soft magnetic upper layer 2, metallization coatings 4 and 5 are applied by means of which the magnetic tunnel contacts 1, 2, 3 can be electrically contacted. The electrical contacting is effected in the illustrated manner via an outer circuit by means of which a voltage V of predetermined level can be applied to the metallization 4, 5 and thus to the tunnel contacts 1, 2, 3.

The electrical resistance of the magnetic tunnel contacts 1, 2, 3, measurable by means of the circuit, is given as R and their cross sectional areas are designated by A. With ΔR, the difference in the electrical resistances for antiparallel and parallel magnetic orientation of the two ferromagnetic layers 1, 2 has been designated. The relative magnetoresistance change $\Delta R/R = (R\uparrow\downarrow - R\downarrow\downarrow)/R\downarrow\downarrow$ is based upon the contact resistance $R\downarrow\downarrow$ for parallel orientation of the ferromagnetic layers 1, 2. All of the values are referred to a room temperature (300 K).

The tunnel contacts 1, 2, 3 are made by the invention as follows:

First on the base metallization 4 the lower hard magnetic seal layer 1 is deposited. In spite of Co other ferromagnetic material, for example, Fe as well as alloys of ferromagnetic material can be used.

In a next stage, a thin Al layer is sputtered onto the lower ferromagnetic layer 1. The sputtered Al layer is subjected to an oxygen atmosphere of about 10 mbar for about 30 minutes for which a mercury low pressure lamp is used to generate the UV radiation. The UV radiation results in a conversion of the molecular oxygen into highly reactive atomic oxygen and ozone.

The oxidation should be so carried out that as much as possible all of the deposited Al layer thickness does not amount to more than about 2 nm.

A further already mentioned advantage of the oxidation method of the invention resides in that the oxidation is stopped at the boundary surface to the underlying ferromagnetic layer 1 in a self-limiting manner. This appears to be a prerequisite for obtaining high quality magnetic tunnel contacts with resistance-area products RA of less than 10 $k\Omega \times \mu m^2$ with relative magnetoresistance changes of greater than 10% (at 300 K).

As a consequence, the oxidation method of the invention overcomes all of the problems arising with the hitherto used oxidation methods: the pure thermal oxidation gives rise indeed to satisfactorily small resistance-area products RA, but is, however, too slow for industrial applications yields only relatively small relative magnetoresistance changes below 6%. The plasma oxidation methods mentioned at the outset is indeed compatible with the time constraints of serial production but gives rise however to resistance-area products RA in excess of 50 $k\Omega \times \mu m^2$.

In the publication "Voltage Dependence of Magnetoresistance in Spin Dependent Tunneling Junctions", J. Zhang and R. M. White, J. Appl. Phys. 83,6512 (1998) it has been explained that so-called "traps" in the tunnel barrier give rise to a drastic reduction of ΔR/R with respect to the applied bias voltage. In excess of plasma oxidation it is to be expected that many traps will be incorporated in the barrier since duration plasma oxidation of the barrier high energy particles of greater than 20 eV are liberated. In contrast thereto, a thermal oxidation (with or without UV light) gives rise to a substantially reduced number of traps in the barrier. Thus it is to be expected that the bias dependency in this case is much less significant than is the case with plasma oxidized barriers.

Thermally oxidized barriers have the advantage, in addition, that it is possible to operate the tunnel contacts in a bias range of 200 mV to 3 V without having the magnetoresistive effect too small for coupling to the semiconductor circuit.

Voltages between 200 mV to 3 V are ideal for signal processing within the semiconductor read circuits.

Following the oxidation step, a NiFe layer 2 is applied as an upper soft magnetic layer. The layer deposition can be effected by means of ion beam vaporization or sputtering.

Finally, in a further step, the magnetic tunnel contacts 1, 2, 3 are structured by the use of lithographic metal mask techniques and ion beam etching.

The investigations carried out within the framework of the invention enabled tunnel contacts 1, 2, 3 to be made with areas between 10 $\mu m^2$ and 400 $\mu m^2$. It was possible (at room temperature) to measure for example resistance-area products RA of 300 $\Omega \times \mu m^2$ and relative magnetoresistance changes ΔR/R of up to 22%. Tunnel contacts with RA=2 $k\Omega \times \mu m^2$ are especially suitable for the described applications, have relative resistance changes which continuously lie above 10% Kerr measurements, indicate a clear separation of coercivity field of the upper NiFe layer 2 and the lower Co layer 1. For Co (hard magnetic) a coercivity field of 15 mT and for NiFe (soft magnetic) a corresponding value of about 0.8 mT was determined.

What is claimed is:

1. A method of producing a magnetic tunnel contact which comprises the steps of:

(a) providing a first ferromagnetic layer;

(b) depositing upon said first ferromagnetic layer an oxidizable metal layer;

(c) oxidizing said metal layer by ultraviolet light oxidation to form therefrom an insulating layer; and (d) forming a second ferromagnetic layer on said insulating layer.

2. The method defined in claim 1 wherein said metal layer is composed of a metal selected from the group which consists of: Al, Mg, Hf, Ta, Zr, Y and Er.

3. The method defined in claim 2 wherein said metal layer is composed of aluminum and is provided in a maximum thickness of 2 nm.

4. The method defined in claim 1 wherein said tunnel contact is structured in a lithographic step and an ion-beam etching step.

5. The method defined in claim 4 wherein an elliptical shape is imparted to said tunnel contact.

6. A magnetic tunnel contact comprising:

a first ferromagnetic layer;

an oxidizable metal layer on said first ferromagnetic layer oxidized by ultraviolet light oxidation to form therefrom an insulating layer; and a second ferromagnetic layer on said insulating layer, said magnetic tunnel contact having:

a relative magnetoresistance change $\Delta R/R$ of greater than 10% at 300K, and a resistance-area product of less than 10 k$\Omega \times \mu m^2$.

7. The magnetic tunnel contact defined in claim 6 wherein the resistance-area product is less than 2 k$\Omega \times \mu m^2$.

8. The magnetic tunnel contact defined in claim 7 wherein the resistance-area product is about 300 $\Omega \times \mu m^2$.

9. The magnetic tunnel contact defined in claim 6 wherein the metal layer is composed of a metal selected from the group which consists of: Al, Mg, Hf, Ta, Zr, Y and Er.

10. The magnetic tunnel contact defined in claim 6 which has an elliptical shape.

11. A memory cell or magnetic field sensor comprising a magnetic tunnel contact, said magnetic tunnel contact comprising:

a first ferromagnetic layer;

an oxidizable metal layer on said first ferromagnetic layer oxidized by ultraviolet light oxidation to form therefrom an insulating layer; and a second ferromagnetic layer on said insulating layer, said magnetic tunnel contact having:

a relative magnetoresistance change $\Delta R/R$ of greater than 10% at 300K, and a resistance-area product of less than 10 k$\Omega \times \mu m^2$.

* * * * *